United States Patent
Zhang et al.

(10) Patent No.: US 9,449,912 B1
(45) Date of Patent: Sep. 20, 2016

(54) INTEGRATED CIRCUIT (IC) CARD HAVING AN IC MODULE AND REDUCED BOND WIRE STRESS AND METHOD OF FORMING

(71) Applicants: STMICROELECTRONICS PTE LTD, Singapore (SG); STMICROELECTRONICS (MALTA) LTD, Kirkop (MT)

(72) Inventors: Xueren Zhang, Singapore (SG); Kim-Yong Goh, Singapore (SG); Roseanne Duca, Ghaxaq (MT)

(73) Assignees: STMICROELECTRONICS PTE LTD, Singapore (SG); STMICROELECTRONICS (MALTA) LTD, Kirkop (MT)

( * ) Notice: Subject to any disclaimer, the term of this patent is extended or adjusted under 35 U.S.C. 154(b) by 0 days.

(21) Appl. No.: 14/736,353

(22) Filed: Jun. 11, 2015

(51) Int. Cl.
*H01L 23/48* (2006.01)
*H01L 23/498* (2006.01)
*H01L 23/00* (2006.01)

(52) U.S. Cl.
CPC ... *H01L 23/49894* (2013.01); *H01L 23/49855* (2013.01); *H01L 24/06* (2013.01); *H01L 24/42* (2013.01); *H01L 24/85* (2013.01); *H01L 2224/04042* (2013.01); *H01L 2224/8592* (2013.01); *H01L 2224/85951* (2013.01)

(58) Field of Classification Search
CPC .......... H01L 23/49894; H01L 23/49855; H01L 24/06; H01L 24/85; H01L 2224/8592; H01L 2224/040402
See application file for complete search history.

(56) References Cited

U.S. PATENT DOCUMENTS

| 5,729,433 | A | 3/1998 | Mok | |
| 6,806,560 | B2* | 10/2004 | Kobayashi | H01L 21/563 257/676 |
| 6,943,437 | B2 | 9/2005 | Blanc et al. | |
| 2009/0261472 | A1* | 10/2009 | Bayerer | H01L 24/06 257/719 |
| 2011/0278638 | A1* | 11/2011 | Lin | H01L 21/486 257/99 |
| 2014/0346684 | A1* | 11/2014 | Kojima | H01L 24/32 257/783 |

FOREIGN PATENT DOCUMENTS

WO 2004105133 2/2004

* cited by examiner

*Primary Examiner* — Yosef Gebreyesus
(74) *Attorney, Agent, or Firm* — Allen, Dyer, Doppelt, Milbrath & Gilchrist, P.A.

(57) ABSTRACT

An integrated circuit (IC) module for an IC card includes a plurality of IC card contacts in side-by-side relation. A dielectric support layer is above the contact layer and has a plurality of openings and a first coefficient of thermal expansion (CTE). An IC die is above the dielectric support layer and includes a plurality of bond pads. A bond wire extends from a respective bond pad to a corresponding contact through an adjacent opening in the dielectric support layer. A respective body of fill material is within each opening and has a second CTE. A mold compound body is above the dielectric support layer, the bodies of fill material, and surrounding the IC die. The mold compound body has a third CTE. The first CTE is closer to the second CTE than to the third CTE.

24 Claims, 6 Drawing Sheets

INTEGRATED CIRCUIT (IC) CARD HAVING AN IC MODULE AND REDUCED BOND WIRE STRESS AND METHOD OF FORMING

FIELD OF THE INVENTION

The present invention relates to the field of integrated circuit (IC) cards, and more particularly, to an integrated circuit (IC) module for an IC card and having thermal matching of fill material at the contacts for reduced bond wire stress.

BACKGROUND OF THE INVENTION

An IC card is a pocket-sized card usually about the size of a normal credit card and having an embedded integrated circuit (IC) die. It is usually made from a flexible plastic. An IC module holds the IC die and the IC module is fixed on the surface of the IC card. The IC die includes a memory and the microprocessor and has electrical contacts that connect to a card reader when the IC card is inserted within the card reader. Bond wires connect the contacts with respective bond pads on the IC die. The IC module for an IC card usually includes eight metallic pads or contacts on its surface and each designed to international standards, including for example, VCC (power supply voltage), RST (used to reset the microprocessor of the IC card), CLK (clock signal), GND (ground), VPP (programming or write voltage), and I/O (serial input/output line). IC cards have random access memory (RAM) and read only memory (ROM) circuits, use a serial interface and receive power from external sources, e.g., the card reader. The RAM serves as a temporary storage for calculations and input/output communications while ROM includes the program memory and instructions for the chip operating system (COS), usually a "mask."

When an IC card is inserted into the card reader, the metallic pads or contacts come into contact with the card reader and connect with metallic pins in the card reader, allowing the card and card reader to communicate. IC cards are reset when they are inserted into a card reader, causing the IC card to respond by sending an "answer-to-reset" (ATR) message, which informs the card reader to control communication and processing of a transaction.

The IC die is typically positioned above a dielectric support layer and includes a plurality of openings. The bond wires extend from a respective bond pad on the IC die to a corresponding contact through an adjacent opening in the dielectric support layer. The bond wire is connected by a "ball" bond on a bond pad and by a "stitch" bond, also known as a wedge bond, to a corresponding contact through an adjacent opening in the dielectric support layer. The stitch bond is usually a weld of the thin bond wire to a plated lead frame post or "finger" using an ultrasonic wire bonding process. It may include a compressed or ultrasonically bonded area of the wire to an underlying bonding surface.

A mold compound body is typically above the dielectric support layer and surrounds an IC die. The mold compound body is usually formed from a material that has a lower coefficient of thermal expansion (CTE), such as an epoxy with filler, as compared to the CTE of the dielectric support layer, which in one example, is formed from an E-glass material also known as a tape. The thermal mismatch created by the two substantially different CTE's may impart high stresses between the mold compound body above the dielectric support layer and the contacts formed at the contact layer causing delamination and a resultant pulling and failure of the bond wire stitch bond to the contact and additional stresses on the IC die.

SUMMARY OF THE INVENTION

An integrated circuit (IC) module for an IC card comprises a contact layer having a plurality of IC card contacts in side-by-side relation. A dielectric support layer is above the contact layer and has a plurality of openings therein. The dielectric support layer has a first coefficient of thermal expansion (CTE). An IC die is above the dielectric support layer and comprises a plurality of bond pads on an upper surface thereof. A plurality of bond wires are included, and each bond wire extends from a respective bond pad to a corresponding contact through an adjacent opening in the dielectric support layer. A respective body of fill material is within each opening in the dielectric support layer. Each body of fill material has a second CTE. A mold compound body is above the dielectric support layer, the bodies of fill material, and surrounding the IC die. The mold compound body has a third CTE. The first CTE is closer to the second CTE than to the third CTE.

The first CTE may be in a range of 60 to 200 PPM/° C. The second CTE may be in a range of 70 to 200 PPM/° C. The third CTE may be in a range of 3 to 50 PPM/° C.

In an embodiment, each body of fill material may fill the respective opening to a level flush with adjacent portions of the dielectric support layer. The dielectric support layer may have peripheral portions extending laterally outwardly from adjacent portions of the mold compound body. The dielectric support layer may comprise E-glass. The contact layer may comprise copper and the mold compound may comprise an epoxy. A first adhesive layer may be between the contact layer and the dielectric support layer, and a second adhesive layer may be between the dielectric support layer and the IC die.

Yet another aspect is directed to a method for making an integrated circuit (IC) module for an IC card. The method may comprise forming a contact layer having a plurality of IC card contacts in side-by-side relation and forming above the contact layer a dielectric support layer having a plurality of openings therein, the dielectric support layer having a first coefficient of thermal expansion (CTE). The method may include positioning an IC die above the dielectric support layer and comprising a plurality of bond pads on an upper surface thereof. The method may further include coupling a plurality of bond wires to the IC card contacts, each bond wire extending from a respective bond pad to a corresponding contact through an adjacent opening in the dielectric support layer. The method may also include forming a respective body of fill material within each opening in the dielectric support layer, each body of fill material having a second CTE. The method may also include forming a mold compound body above the dielectric support layer, the bodies of fill material, and surrounding the IC die. The mold compound body has a third CTE. The first CTE may be closer to the second CTE than to the third CTE.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
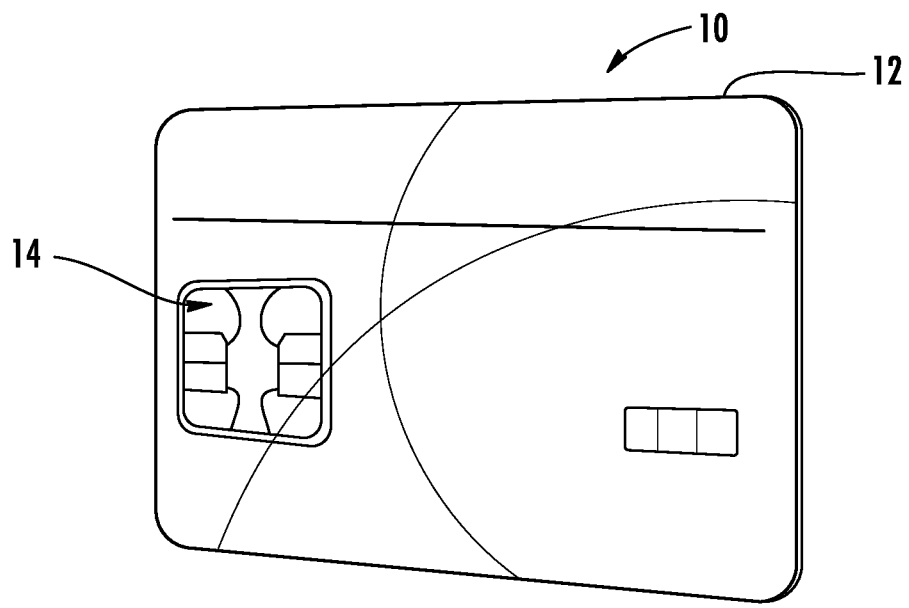
FIG. 1 is a perspective view of an IC card showing the integrated circuit (IC) module carried by the IC card body as in the prior art.

An IC card (or chip card) 10 is shown in FIG. 1 and includes the IC card body 12 and an integrated circuit (IC) module 14 carried by the IC card body and having a plurality of IC card contacts 16 formed at a contact layer 18 as explained in greater detail below. In this example, the IC card 10 is a pocket-sized card about the size of a conventional credit card and includes an embedded integrated circuit die as part of the IC module 14. The IC card body 12 is usually made from a flexible plastic material such as polyvinyl chloride, polyethylene terephthalate based polyester, acrylonitrile butadiene styrene (ABS), or polycarbonate. The IC card body 12 can also be formed from different card layers that are printed and laminated in a large press, followed by blanking or die cutting and then embedding the IC die.

Figure 2:
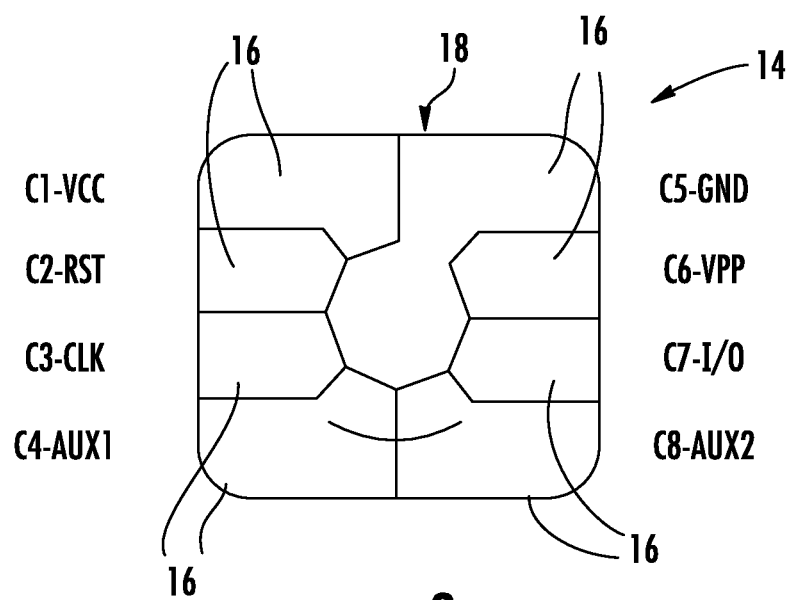
FIG. 2 is a plan view of the IC module showing the configuration of the IC card contacts arranged in side-by-side relation as in the prior art.

The contact layer 18 of the IC module 14 is shown in FIG. 2 where the plurality of IC card contacts 16 are formed in side-by-side relation. The IC card contacts 16 in FIG. 2 also correspond to what is termed a IC card pinout as eight metallic pads and designed to international standards. For example, the VCC as contact C1 is for the power supply voltage. Contact C2 corresponds to the RST contact for the reset signal used to reset the microprocessor of the IC card and reset card communications. Contact C3 is the CLK contact corresponding to the clock signal from which the data communications timing is derived. Contact C5 corresponds to the ground (GND) as a reference voltage. Contact C6 is VPP corresponding to the write voltage.

For example, the ISO/IEC 7816-3 standard designates a programming voltage and an input for a higher voltage to program persistent memories such as an EEPROM. Alternatively, the ISO/IEC 7816-3: 2006 standard designates SPU for either standard or proprietary use as an input and/or output. Contact C7 corresponds to the I/O as the serial input/output line and typically an output as half-duplex. The remaining contacts C4 and C8 are auxiliary contacts as AUX1 and AUX2 and may be used for USB interfaces and other ancillary uses.

IC cards such as shown in FIGS. 1 and 2 usually include a random access memory (RAM) and read only memory (ROM) and employ a serial interface. They receive power from external sources, e.g., the card reader, in most examples. The RAM serves as a temporary storage for calculations and input/output communications, while ROM includes the program memory and instructions for the chip operating system (COS) as a "mask" in most cases. Some IC cards may have 8-bit symmetric key (file based) EEPROM and 8, 16 and 32-bit public key encryption with a math coprocessor. The IC card operating system or chip operating system may include a fixed file structure or a dynamic application system with different encryption capabilities such as Symmetric Key or Asymmetric Key (public key). Some cards have up to eight kilobytes of RAM and 346 kilobytes of ROM with 256 kilobytes of programmable ROM and a 16-bit microprocessor. These values can vary depending on card design.

Usually the contact layer 18 forming the plurality of IC card contacts 16 as shown in FIG. 2 has a contact area of about a square centimeter (0.16 square inches) as the eight gold-plated contact pads formed over the copper contact layer. The rectangular dimensions of the IC card 10 such as shown in FIG. 1 are usually similar to those of a conventional credit card. For example, ID-1 of the ISO/IEO 7810 standard defines the IC card at about 85.60 by 53.98 millimeters (3.370 inches by 2.125 inches). Another popular size for the IC card 10 is ID-000, which is nominally about 25 by 15 millimeters (0.984 inches by 0.591 inches) and commonly used in SIM cards. Usually, IC cards are about 0.76 millimeters (0.030 inches) thick. These values can vary, of course, depending on IC card design requirements. Usually there is a tamper-resistant security system such as a secure cryptoprocessor and a secure file system.

When the IC card 10 is inserted into a card reader, the metallic pads, i.e., IC card contacts 16 come into contact with the card reader and connect with the metallic pins in the card reader, allowing the card and card reader to communicate. The IC card 10 is reset when it is inserted into the card reader, causing the IC card to respond by sending an "answer-to-reset" (ATR) message, which informs the card reader to control communication and processing of the transaction.

Figure 3:
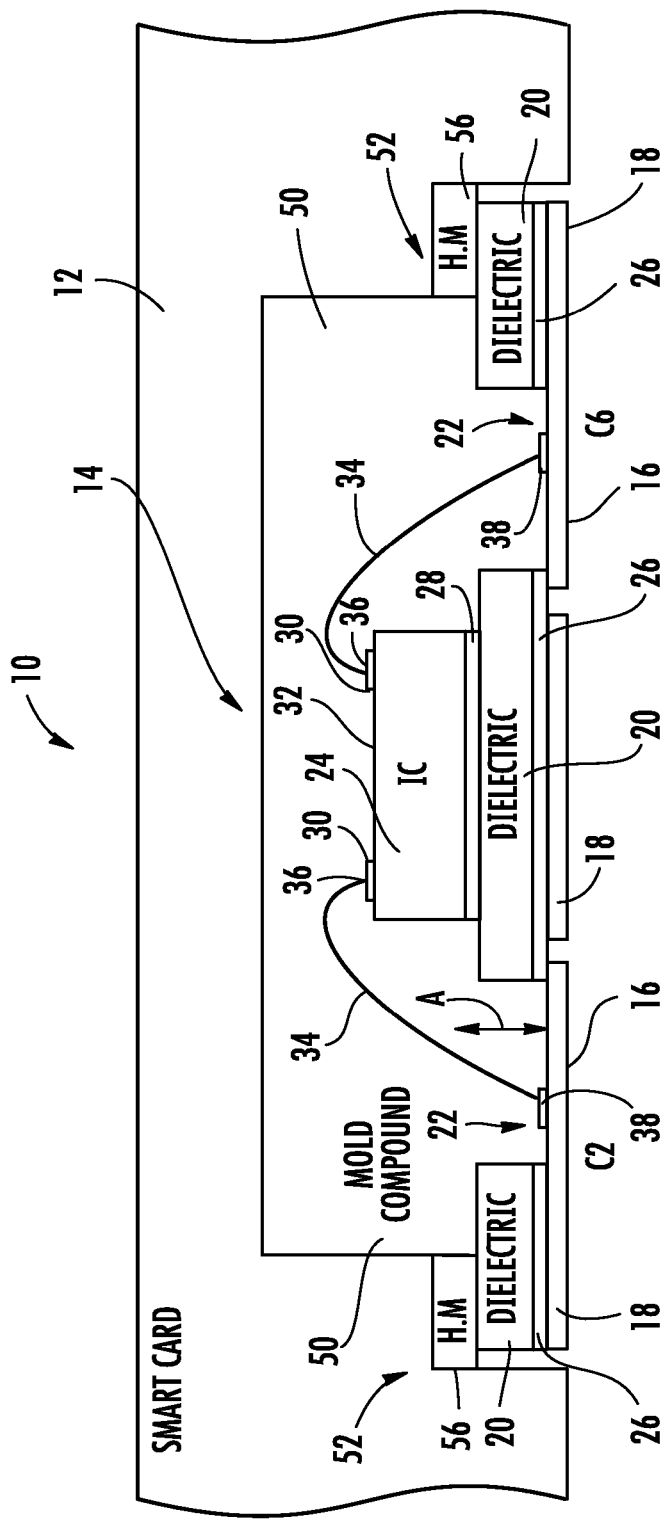
FIG. 3 is a sectional view of a portion of a prior art IC card without fill material and showing bond wires extending from bond pads on the IC die through adjacent openings in the dielectric support layer and connected to IC card contacts.

FIG. 3 is a fragmentary sectional view of a conventional IC card 10 similar to that shown in FIGS. 1 and 2 and showing the IC card body 12 and IC module 14 carried by the body. The IC module 14 includes the contact layer 18 described before that forms the plurality of IC card contacts 16 in side-by-side relation. The contact layer 18 is usually formed from copper, but other conductive materials may be used. Often, a thin gold foil layer is attached to the copper to form the outer surface of each IC card contact 16.

Figure 5:
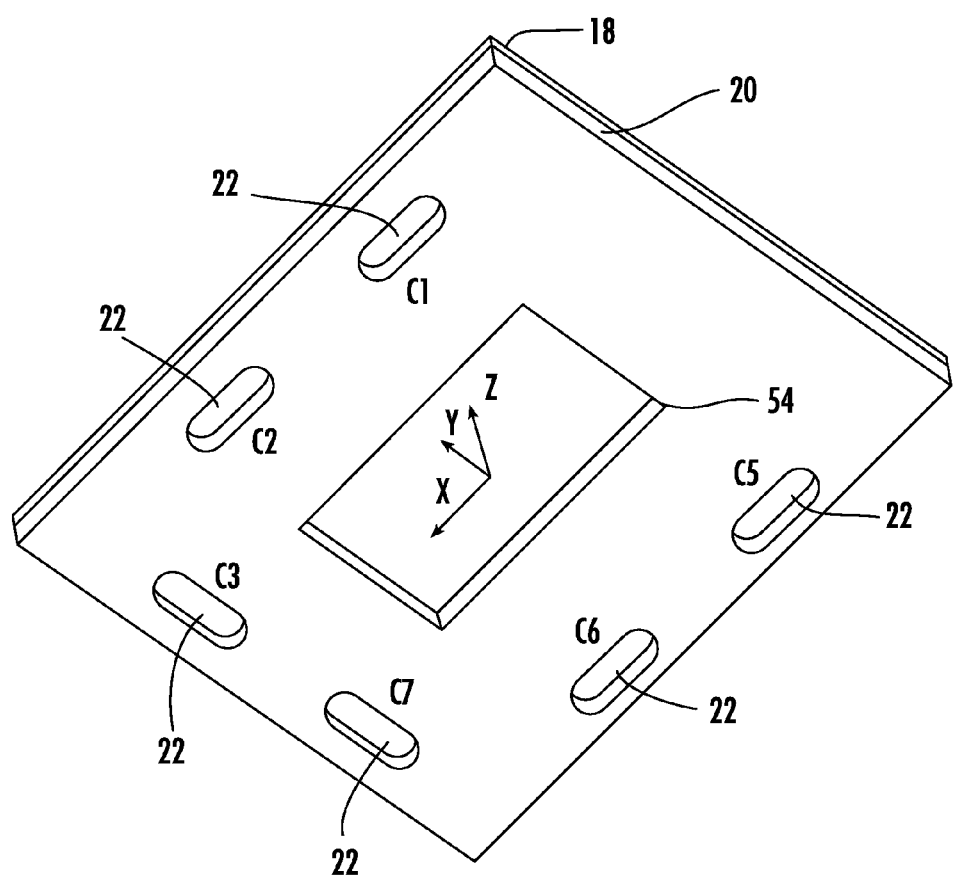
FIG. 5 is a fragmentary, perspective view of a portion of the IC module without fill material and showing the contact layer and dielectric support layer and openings that form the wire bonding pots into which the bond wires extend to connect to the respective IC card contacts as in the prior art.

A dielectric support layer 20 is formed above the contact layer 18 and includes a plurality of openings 22 as illustrated. These openings 22 are often referred to by those skilled in the art as wire bonding pots. An example of the wire bonding pots as openings 22 is shown in FIG. 5 that illustrates six openings in this example for six contacts C1-C3 and C5-C7 without showing the auxiliary contacts C4 and C8 as shown in FIG. 2. The contact layer 18 is illustrated below the dielectric support layer 20 and a IC die 24 is positioned above the dielectric support layer. In this example, the dielectric support layer 20 is formed from E-glass, which is alumino-borosilicate glass with less than 1% to 2% w/w alkali oxides in many examples. It is considered an "E" type of glass because of its initial electrical application and is substantially alkali free although it may be somewhat susceptible to chloride ion attack. The E-glass does not melt, but softens. Because of the type of E-glass typically used with the IC module 14, it has a coefficient of thermal expansion (CTE) as low as about 60 to as high as about 200 PPM/° C.

A first adhesive layer 26 such as an epoxy adhesive, as a non-limiting example, is between the contact layer 18 and the dielectric support layer 20 to adhere the contact layer 18 to the dielectric support layer. This dielectric support layer 20 is also referred to as a "tape" since it is often applied as a sheet, similar to a tape. The IC die 24 is above the dielectric support layer 20 and a second adhesive layer 28, such as an epoxy layer, is between the dielectric support layer 20 and the IC die 24 and adheres the IC die to the dielectric support layer. The IC die 24 includes a plurality of bond pads 30 on an upper surface 32 as illustrated. The plurality of bond wires 34 are illustrated and each bond wire extends from a respective bond pad 30 to a corresponding IC card contact 16 through an adjacent opening 22 in the dielectric support layer 20. Usually the bond wire 34 is connected by a "ball" bond 36 onto a respective bond pad 30 and by a "stitch" bond 38, also known as the wedge bond, to a corresponding IC card contact 16 through the adjacent opening 22 in the dielectric support layer 20. The stitch bond 38 is usually a weld of the thin bond wire to a plated lead frame post or "finger" using an ultrasonic wire bonding process and may include a compressed or ultrasonically bonded area of the wire to an underlying bonding surface.

The ball-bonding process typically includes a bonding wire made of gold, copper or palladium and usually from 15-50 um in diameter. The actual diameter will depend on the wire length, device power and wire loop height and other factors specific to the IC card design. The wire bonding process uses the ball-bonding process on the bond pads 30 located on the upper surface of the IC die 24 and requires first forming a ball on one end of the bond wire and then welding that formed ball to the bond pad 30. The bond wire 34 is looped across the top of the IC die 24 and into the adjacent opening 22 in the dielectric support layer 20. The stitch bonding process bonds the bond wire 34 to a corresponding IC card contact 16. The stitch bond 38 usually has a particular width of stitch related to the diameter of the bond wire and, in one example, a typical minimum required area to bond the stitch measures about 90 by 90 um for a 15 um wire diameter, and 300 by 300 um for a 50 um wire diameter, and 150 by 150 um for a 25 um wire diameter.

As shown in FIG. 3, a mold compound body 50 is above the dielectric support layer 20 and surrounds the IC die 24 and forms the IC module 14. Usually the mold compound body 50 is formed from an epoxy resin and may include a filler as a non-melting inorganic material and catalysts that accelerate the cure reaction. The final mold material may also include a pigment or colorant and include flame retardants, adhesion promoters, ion traps and stress relievers. Many of the epoxy mold compound bodies include fused silica. The various components, including fillers, are chosen to reduce the coefficient of thermal expansion (CTE) of the mold compound and minimize or reduce internal stresses. Increasing the filler loading, such as fused silica, usually reduces the CTE because the CTE of fused silica is about 10% of epoxy resin. Because increasing the filler content may degrade flow and modulus of the mold compound material, the epoxy may include formulators to maintain flow and modulus, for example, by lowering the polymer melt viscosity. The epoxy resin and filler content may be chosen based on the desired chip design, package design, mold process, test requirement, and formulators. Some of the mold compound bodies that form an encapsulant for the IC die are based on a reaction of epoxy cresol novolac with phenol novolac. Epoxies will wet many high-tension synthetic surfaces and form strong, stable bonds to metallic oxides. This type of mold compound body 50 adheres well not only to the IC die 24, but also the dielectric support layer 20 formed from E-glass and the contact layer 18 formed from copper. The mold compound body 50 may have a coefficient of thermal expansion usually under about 50 PPM/° C., and thus, can range from as low as about 3 or 5 PPM/° C. to as high as about 50 PPM/° C. The dielectric support layer 20 usually has a much greater coefficient of thermal expansion than the mold compound body 50 and delamination may occur between the mold compound body and the IC card contact 16 in the openings 22 at the dielectric support layer. The stitch bond may weaken because of the thermal mismatch in the Z direction as shown by the vertical arrow A in FIG. 3 that exists between the mold compound body 50 and the dielectric support layer 20.

As illustrated, the dielectric support layer 20 has peripheral portions 52 that extend laterally outward from adjacent portions of the mold compound body 50. These portions 52 help position and support the IC module 14 in a IC card module receive area 54 formed in the IC card body 12 as shown, for example, in FIG. 5. To help retain the IC module 14 relative to the IC card body 12, a hot melt adhesive 56 may be positioned between the peripheral portions 52 extending laterally outward from adjacent portions of the mold compound body 50 and the IC card body 12. Other materials can be used, but hot melt adhesives have been found advantageous.

Figure 4:
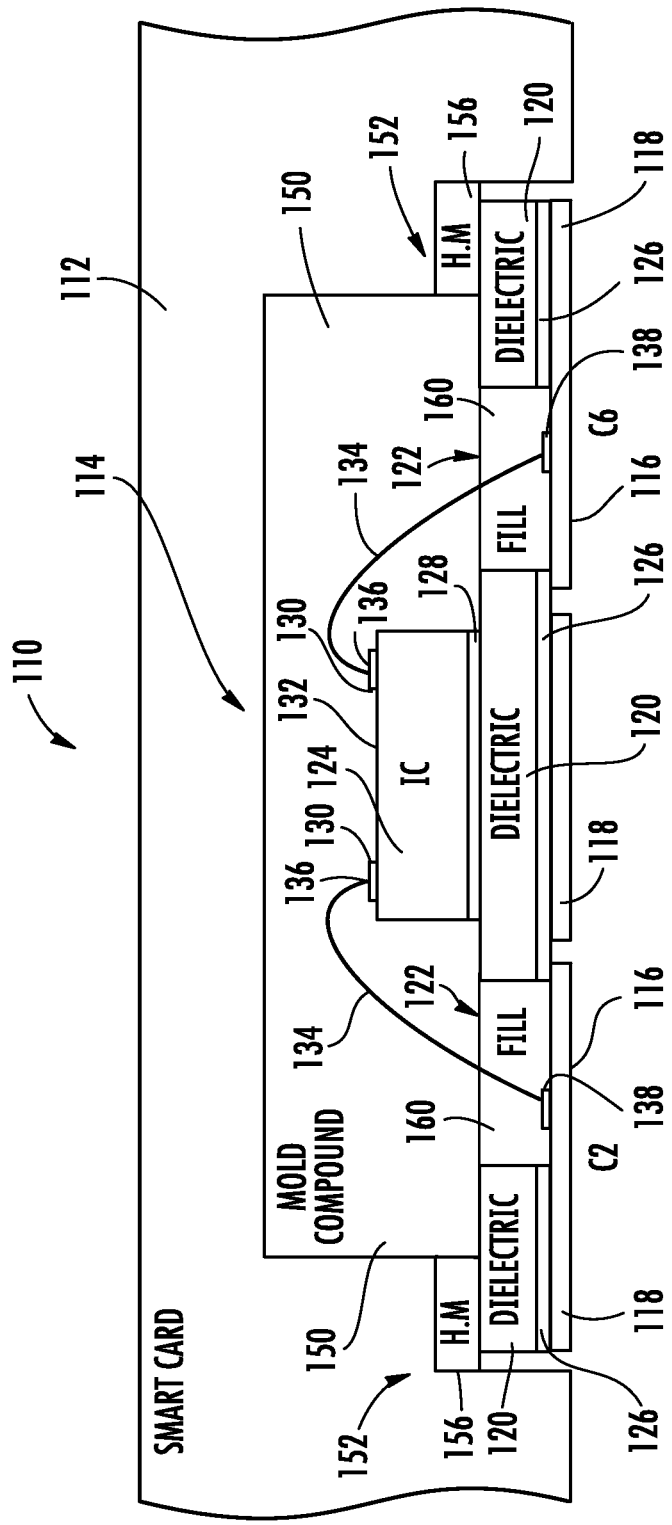
FIG. 4 is a sectional view similar to FIG. 3 but showing a body of fill material within each opening in the dielectric support layer that matches more the coefficient of thermal expansion of the dielectric support layer to reduce stress at the IC card contacts in accordance with the invention.

To alleviate the stresses between the mold compound body and the IC card contacts formed at the contact layer, a respective body of fill material is within each opening in a dielectric support layer, in accordance with a non-limiting example, to aid in relieving these stresses as illustrated in FIG. 4. It fills a respective opening to a level flush with adjacent portions of the dielectric support layer. For purposes of description, the IC card illustrated in FIG. 4 is given reference numerals in the 100 series with those common elements having the same 100 series as in a lower numeral series as referenced in FIG. 3.

As illustrated in FIG. 4, in accordance with a non-limiting example for the fill material, the IC card 110 includes the IC card body 112 and the IC module 114 carried thereby and including the contacts 116 and contact layer 118 and dielectric support layer 120 with the openings 122 forming what is termed the wire bonding pots. The IC die 124 is above the dielectric support layer 120 and includes the plurality of IC bond pads 130 on the upper surface 132 thereof with the bond wires 134 extending from a respective bond pad to a corresponding IC card contact 116 through an adjacent opening 122 in the dielectric support layer 120. The respective body of fill material is illustrated at 160 within each opening 122 in the dielectric support layer 120. Each body of fill material 160 has a second CTE of about 70 to about 200. This CTE is similar or closer to the first CTE of the dielectric support layer 120 (having a CTE of about 60 to 200 PPM/° C.) than the third CTE of the mold compound body 150, which is usually much lower (e.g., 3 to 50 PPM/°

C.) as explained above. The mold compound body 150 is above the dielectric support layer 120 and the body of fill material 160 and surrounds the IC die 124 and this mold compound body 150 has a third CTE. The first CTE is closer to the second CTE than the third CTE. Also included are the first adhesive layer 126 and second adhesive layer 128 and hot melt adhesive 156 between the peripheral portions 152 extending laterally outward from adjacent portions of the mold compound body 150 and the IC card body 122.

The respective bodies of fill material 160 within each opening 122 in the dielectric support layer 120 could be formed from an adhesive that has a different filler to create a coefficient of thermal expansion that is closer to the coefficient of thermal expansion of the dielectric support layer and could have a similar range. For example, it could range from about 70 to about 200. As a result, the stress at the contacts 116 is lower while also reducing die stress since the bond wires 134 may not be pulled permitting greater stability in the IC module 114 and also relative to the IC card 110.

FIG. 5 is a perspective view of a portion of FIG. 3 showing the contact layer 18 and dielectric support layer 20 and illustrating the plurality of openings 22 in the dielectric support layer that form the wire bonding pots and form the interface between the mold compound body 50 and the contact layer 18 in the example of FIG. 3, where there is no fill material within each opening and only a mold compound body.

Figure 6:
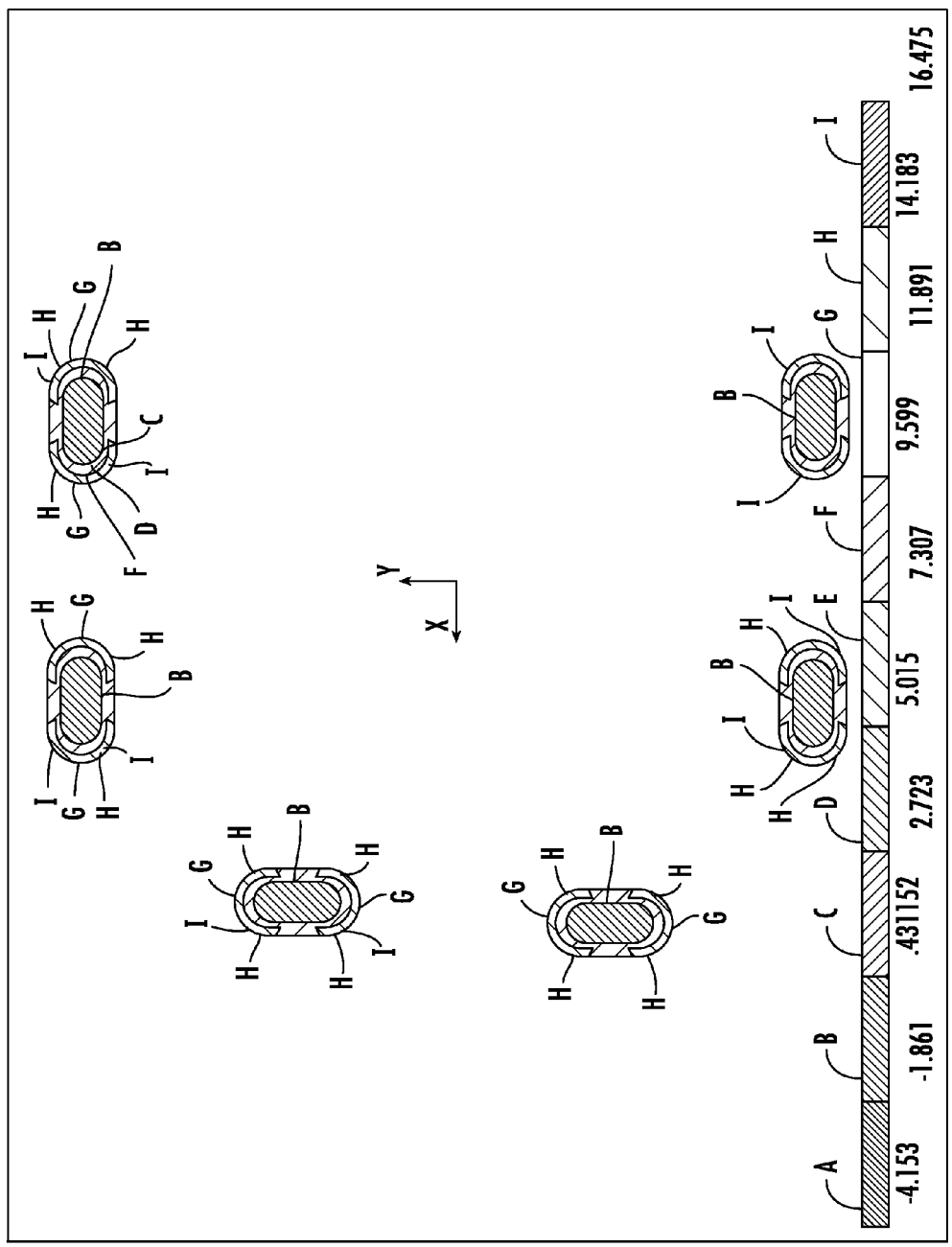
FIG. 6 is a first simulation of field stress results when the mold compound body extends through the openings to the contact layer and showing the high peel stress at the mold compound body and contact layer as in the prior art.
Figure 7:
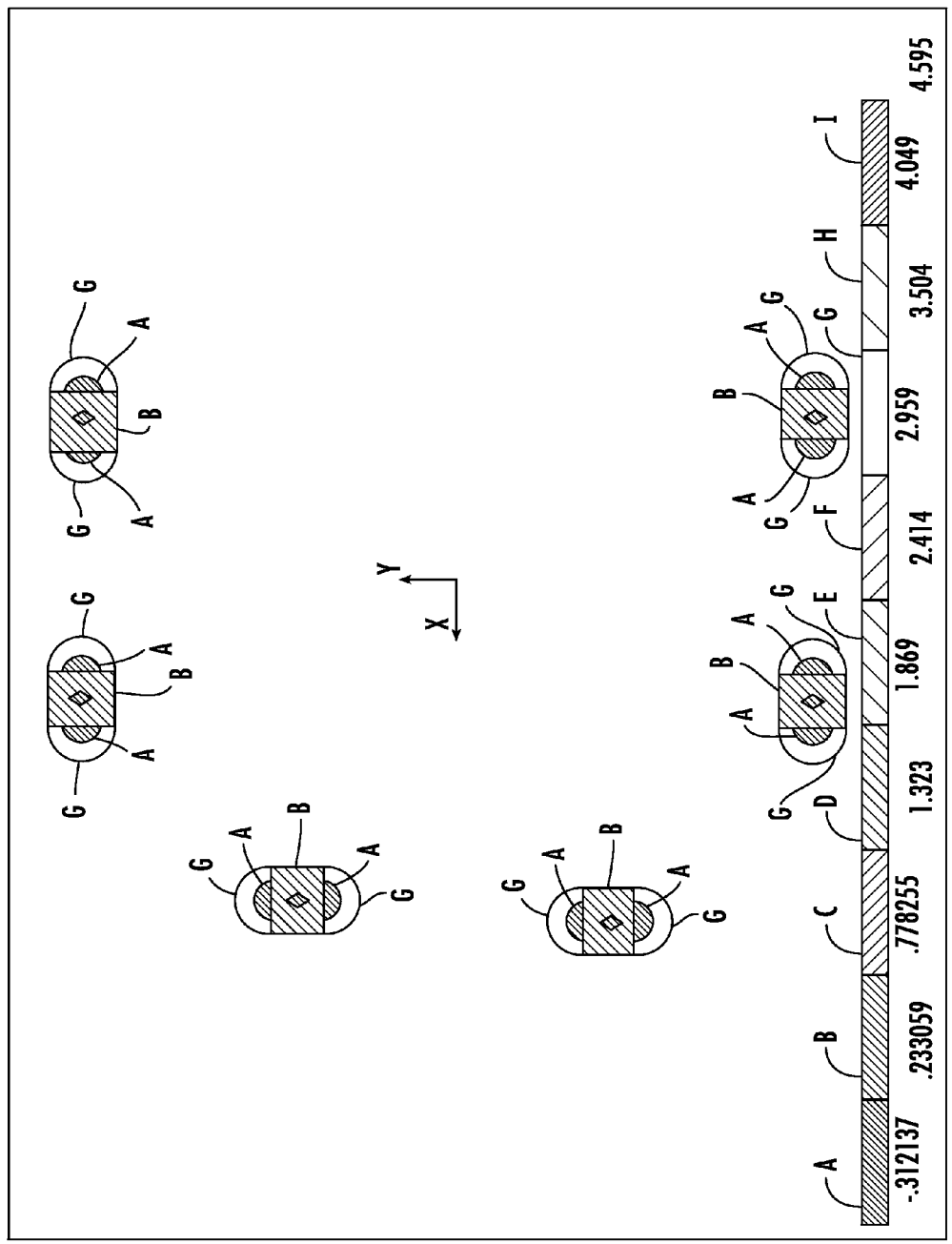
FIG. 7 is a second simulation of field stress results when the respective body of fill material extends within each opening in the dielectric support layer in accordance with a non-limiting example and showing the reduced peel stress in accordance with the invention.

FIGS. 6 and 7 illustrate simulation results with the results shown in FIG. 6 corresponding to when the mold compound body 50 is encapsulating the IC die 24 and extends into the dielectric support layer openings 22 forming the wire bonding pots as in the prior art. These results show the high peel stress of 16.5 MPa on the peripheral edges of the IC card contacts 16 in the contact layer 18. FIG. 7 shows the simulation results when the body of fill material 160 extends within each opening 122 as in FIG. 4, in accordance with the present invention, and showing the reduced stress of only 4.6 MPa with the use of the fill material in the openings instead of the mold compound body. For purposes of illustration, the different stresses are labeled A from the lowest of −4.153 up to the highest of I of 16.475 MPa and shows the regions of stress.

Another aspect relative to a IC card that may comprise a IC card body and the IC card integrated circuit (IC) module carried thereby. Yet another aspect is directed to a method for making an integrated circuit (IC) module for a IC card. The method may comprise forming a contact layer having a plurality of IC card contacts in side-by-side relation and forming above the contact layer a dielectric support layer having a plurality of openings therein, the dielectric support layer having a first coefficient of thermal expansion (CTE). The method may include positioning an IC die above the dielectric support layer and comprising a plurality of bond pads on an upper surface thereof. The method may further include coupling a plurality of bond wires to the IC card contacts, each bond wire extending from a respective bond pad to a corresponding contact through an adjacent opening in the dielectric support layer. The method may also include forming a respective body of fill material within each opening in the dielectric support layer, each body of fill material having a second CTE. The method may also include forming a mold compound body above the dielectric support layer, the bodies of fill material, and surrounding the IC. The mold compound body has a third CTE. The first CTE may be closer to the second CTE than to the third CTE.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit (IC) module for an IC card comprising:
   a contact layer comprising a plurality of IC card contacts in side-by-side relation;
   a dielectric support layer above said contact layer and having a plurality of openings therein, said dielectric support layer having a first coefficient of thermal expansion (CTE);
   an IC die above said dielectric support layer and comprising a plurality of bond pads on an upper surface thereof;
   a plurality of bond wires, each bond wire extending from a respective bond pad to a corresponding contact through an adjacent said plurality of openings in said dielectric support layer;
   a respective body of fill material within each said plurality of openings in said dielectric support layer, each body of fill material having a second CTE; and
   a mold compound body above said dielectric support layer, said bodies of fill material, and surrounding said IC die, said mold compound body having a third CTE;
   said first CTE being closer to the second CTE than to the third CTE.

2. The IC module according to claim 1 wherein said first CTE is in a range of 60 to 200 PPM/° C.

3. The IC module according to claim 1 wherein said second CTE is in a range of 70 to 200 PPM/° C.

4. The IC module according to claim 1 wherein said third CTE is in a range of 3 to 50 PPM/° C.

5. The IC module according to claim 1 wherein each body of fill material fills the respective opening to a level flush with adjacent portions of said dielectric support layer.

6. The IC module according to claim 1 wherein said dielectric support layer has peripheral portions extending laterally outwardly from adjacent portions of said mold compound body.

7. The IC module according to claim 1 wherein said dielectric support layer comprises E-glass.

8. The IC module according to claim 1 wherein said contact layer comprises copper.

9. The IC module according to claim 1 wherein said mold compound comprises an epoxy.

10. The IC module according to claim 1 further comprising a first adhesive layer between said contact layer and said dielectric support layer.

11. The IC module according to claim 1 further comprising a second adhesive layer between said dielectric support layer and said IC die.

12. An Integrated Circuit (IC) card comprising:
   an IC card body and an integrated circuit (IC) module carried thereby;
   said IC module comprising
   a contact layer comprising a plurality of IC card contacts in side-by-side relation,
   a dielectric support layer above said contact layer and having a plurality of openings therein, said dielectric support layer has a first coefficient of thermal expansion (CTE), an IC die above said dielectric support layer and comprising a plurality of bond pads on an upper surface thereof, a plurality of bond wires, each bond wire extending from a respective bond pad to a corresponding contact through an adjacent said plurality of openings in said dielectric support layer, a respective body of fill material within each said plurality of openings in said dielectric support layer, each body of fill material having a second CTE, and a mold compound body above said dielectric support layer, said bodies of fill material, and surrounding said IC die, said mold compound body having a third CTE, said first CTE being closer to the second CTE than to the third CTE.

13. The IC card according to claim 12 wherein said first CTE is in a range of 60 to 200 PPM/° C.

14. The IC card according to claim 12 wherein said second CTE is in a range of 70 to 200 PPM/° C.

15. The IC card according to claim 12 wherein said third CTE is in a range of 3 to 50 PPM/° C.

16. The IC card according to claim 12 wherein each body of fill material fills the respective opening to a level flush with adjacent portions of said dielectric support layer.

17. The IC card according to claim 12 wherein said dielectric support layer has peripheral portions extending laterally outwardly from adjacent portions of said mold compound body.

18. The IC card according to claim 12 wherein said dielectric support layer comprises E-glass, said contact layer comprises copper, and said mold compound comprises an epoxy.

19. A method for making an integrated circuit (IC) module for an IC card comprising:

forming a contact layer comprising a plurality of IC card contacts in side-by-side relation;

forming a dielectric support layer above the contact layer and having a plurality of openings therein, the dielectric support layer having a first coefficient of thermal expansion (CTE);

positioning an IC die above the dielectric support layer and comprising a plurality of bond pads on an upper surface thereof;

coupling a plurality of bond wires to the IC card contacts, each bond wire extending from a respective bond pad to a corresponding contact through an adjacent said plurality of openings in the dielectric support layer;

forming a respective body of fill material within each said plurality of openings in the dielectric support layer, each body of fill material having a second CTE; and forming a mold compound body above the dielectric support layer, the bodies of fill material, and surrounding the IC die, the mold compound body having a third CTE;

the first CTE being closer to the second CTE than to the third CTE.

20. The method according to claim 19 wherein the first CTE is in a range of 60 to 200 PPM/° C.

21. The method according to claim 19 wherein the second CTE is in a range of 70 to 200 PPM/° C.

22. The method according to claim 19 wherein said third CTE is in a range of 3 to 50 PPM/° C.

23. The method according to claim 19 wherein each body of fill material is formed to fill the respective opening to a level flush with adjacent portions of said dielectric support layer.

24. The method according to claim 19 wherein the dielectric support layer is formed to have peripheral portions extending laterally outwardly from adjacent portions of said mold compound body.

* * * * *